United States Patent
Devie et al.

(10) Patent No.: US 12,366,609 B2
(45) Date of Patent: Jul. 22, 2025

(54) METHODS AND SYSTEMS FOR DETECTING VARIATIONS IN MINOR TOTAL-IMPEDANCE CONTRIBUTORS IN ELECTROCHEMICAL CELLS

(71) Applicant: Element Energy, Inc., Menlo Park, CA (US)

(72) Inventors: Arnaud Devie, San Carlos, CA (US); Georgy Zerkalov, San Jose, CA (US); Rainer Johannes Fasching, Mill Valley, CA (US); Nathan Brinkerhoff, Providence, RI (US)

(73) Assignee: Element Energy Inc., Menlo Park, CA (US)

( * ) Notice: Subject to any disclaimer, the term of this patent is extended or adjusted under 35 U.S.C. 154(b) by 118 days.

(21) Appl. No.: 18/066,404

(22) Filed: Dec. 15, 2022

(65) Prior Publication Data

US 2023/0184844 A1 Jun. 15, 2023

Related U.S. Application Data

(60) Provisional application No. 63/265,480, filed on Dec. 15, 2021.

(51) Int. Cl.
*G01R 31/389* (2019.01)
*G01R 31/36* (2020.01)
(Continued)

(52) U.S. Cl.
CPC ....... *G01R 31/389* (2019.01); *G01R 31/3648* (2013.01); *G01R 31/374* (2019.01); *G01R 31/3835* (2019.01)

(58) Field of Classification Search
CPC .............. G01R 31/389; G01R 31/3835; G01R 31/374; G01R 31/3648
See application file for complete search history.

(56) References Cited

U.S. PATENT DOCUMENTS 11,125,707 B1  9/2021  Fasching et al.
11,131,717 B1  9/2021  Fasching et al.
(Continued)

FOREIGN PATENT DOCUMENTS

JP    5662968 B2    2/2015
WO   2016208745 A1  12/2016

OTHER PUBLICATIONS

International Application Serial No. PCT/US22/81614, Preliminary Report on Patentability mailed Jun. 27, 2024, 7 pgs.
(Continued)

*Primary Examiner* — Christopher E Mahoney
(74) *Attorney, Agent, or Firm* — Polygon IP, LLP

(57) ABSTRACT

Described herein are methods and systems for detecting variation in minor total-impedance contributors in sets of electrochemical cells. For example, a method comprises maintaining a substantially constant current through the set of electrochemical cells and obtaining multiple voltage readings of the cells while the substantially constant current is maintained. The method then proceeds with determining multiple differential capacity values from the multiple voltage readings, characterizing one or more peaks in the multiple differential capacity values, and determining the variation in the minor total-impedance contributor based on one or more peaks. More specifically, partial capacitance values can be assigned to different impedance channels based on these peaks or, more specifically, based on the separation of adjacent peaks. The variation in the minor total-impedance contributor can be attributed to one or more of a tap-weld quality, electrolyte wetting, tape damage, active material activation energy variations, and diffusion variation of the ion-conducting material.

20 Claims, 11 Drawing Sheets

(51) Int. Cl.
    *G01R 31/374*     (2019.01)
    *G01R 31/3835*     (2019.01)

(56)     References Cited

U.S. PATENT DOCUMENTS

| | | | | |
|---|---|---|---|---|
| 11,513,159 | B1* | 11/2022 | Fotak | G01R 31/007 |
| 2012/0105069 | A1 | 5/2012 | Wang et al. | |
| 2012/0169288 | A1 | 7/2012 | Jeki et al. | |
| 2013/0119940 | A1 | 5/2013 | Iriyama et al. | |
| 2021/0349157 | A1* | 11/2021 | Srinivasan | G01R 31/389 |
| 2022/0381845 | A1* | 12/2022 | Yagi | G01R 31/3648 |
| 2023/0152382 | A1* | 5/2023 | Park | H01M 8/04589 |
| | | | | 324/430 |

OTHER PUBLICATIONS

Int'l Application Serial No. PCT/US22/81614, ISR/WO mailed May 3, 2023, 11 pgs.

* cited by examiner

METHODS AND SYSTEMS FOR DETECTING VARIATIONS IN MINOR TOTAL-IMPEDANCE CONTRIBUTORS IN ELECTROCHEMICAL CELLS

CROSS-REFERENCE TO RELATED APPLICATIONS

This application claims the benefit under 35 U.S.C. § 119(e) of US Provisional Patent Application 63/265,480, filed on 2021 Dec. 15, which is incorporated herein by reference in its entirety for all purposes.

BACKGROUND

Determining different failure modes in electrochemical cells can be challenging. An electrochemical cell is a complex system of mechanical, electrical, and chemical components with various overlapping functions and characteristics. Once electrochemical cells are integrated into battery modules and packs, the complexity only increases. Furthermore, additional problems can be added during this integration, such as connections to the cells. At the same, the importance of early and accurate detection of various failure modes only increases.

What is needed are new methods and systems for determining failure modes attributable to variations in minor total-impedance contributors in various sets of electrochemical cells.

SUMMARY

Described herein are methods and systems for detecting variation in minor total-impedance contributors in sets of electrochemical cells. For example, a method comprises maintaining a substantially constant current through the set of electrochemical cells and obtaining multiple voltage readings from this while the substantially constant current is maintained. The method then proceeds with determining multiple differential capacity values from the multiple voltage readings, characterizing one or more peaks in the multiple differential capacity values, and determining the variation in the minor total-impedance contributor based on one or more peaks. More specifically, partial capacitance values can be assigned to different impedance channels based on these peaks or, more specifically, based on the separation of adjacent peaks. The variation in the minor total-impedance contributor can be attributed to one or more of a tab-weld quality, electrolyte wetting, tape damage, active material activation energy variations, and diffusion variation of the ion-conducting material.

For example, non-uniform welding of one or more connections in battery cells (e.g., welding of internal tabs to electrode current collectors, tab welds to cell terminals) can contribute to different types of impedance, reflected in the total cell capacity. These different impedance types can be detected with methods disclosed herein. Specifically, different impedance types correspond to different cell capacity signatures, which can be obtained during cell charge/discharge. In other words, these different capacity signatures will reflect different impedance channels. In another example, described methods can be used to detect the activation of electrode active materials or, more specifically, when this activation is not uniform. For example, nonuniform activation will cause an impedance change of the different capacity parts and, therefore, spread out over the impedance channels. In yet another example, described methods can be used to detect nonuniform electrolyte filling, e.g., which cases different electrolyte impedances in the cell. When solid electrolytes are used, the method can detect non-uniformity in the electrolyte thicknesses and/or conductivity.

In some examples, a method of detecting a variation in a minor total-impedance contributor of a total impedance in a set of electrochemical cells is provided. The method comprises maintaining a substantially constant current through the set of electrochemical cells, obtaining multiple voltage readings from the set of electrochemical cells while the substantially constant current is maintained through the set of electrochemical cells, determining multiple differential capacity values from the multiple voltage readings, and determining the variation in the minor total-impedance contributor based on the multiple differential capacity values.

In some examples, the method further comprises characterizing one or more peaks in the multiple differential capacity values. Specifically, determining the variation in the minor total-impedance contributor is performed based on these peaks, which are associated with different impedance channels. For example, characterizing these peaks in the multiple differential capacity values can comprise one of (a) determining second-order differential capacity values from the multiple differential capacity values, or (b) comparing a plot of the multiple differential capacity values to a reference plot.

In some examples, the total impedance is determined by the minor total-impedance contributor and a major total-impedance contributor. The minor total-impedance contributor is attributed to a first portion of the set of electrochemical cells. The major total-impedance contributor is attributed to a second portion of the set of electrochemical cells, connected in series with the first portion.

In some examples, the set of electrochemical cells comprises multiple electrochemical cells connected in parallel.

In some examples, the variation in the minor total-impedance contributor is attributed to one or more characteristics selected from the group consisting of tab-weld quality, electrolyte wetting, tape damage, active-material activation energy variations material, and diffusion variations of an electrolyte of the electrochemical cells. For example, the variation in the minor total-impedance contributor is used to differentiate one of these characteristics. In more specific examples, the method further comprises associating the variation in the minor total-impedance contributor with one or more battery defects in the set of electrochemical cells.

In some examples, the multiple voltage readings are obtained from the set of electrochemical cells when the electrochemical cells are at a state of charge (SOC) selected based on and away from phase transition peaks of active materials of the electrochemical cells.

In some examples, the method further comprises (a) maintaining an additional substantially constant current through the set of electrochemical cells, wherein the additional constant current is different from the constant current, (b) obtaining additional multiple voltage readings from the set of electrochemical cells while the additional substantially constant current is maintained through the set of electrochemical cells, (c) determining additional multiple differential capacity values from the additional multiple voltage readings, (d) characterizing one or more additional peaks in the multiple additional differential capacity values, and (e) determining the variation in the minor total-impedance contributor based on theses additional peaks. For example, the additional substantially constant current is selected such that the one or more additional peaks, in the additional multiple differential capacity values, are more detectable than one or more peaks in the multiple differential capacity values determined while the set of electrochemical cells is subjected to the substantially constant current.

In some examples, maintaining the substantially constant current through the set of electrochemical cells is performed at a first temperature. The method further comprises (a) heating or cooling the set of electrochemical cells to a second temperate, different from the first temperature, (b) maintaining the substantially constant current through the set of electrochemical cells while the set of electrochemical cells is at the second temperate; (c) obtaining an additional set of multiple voltage readings from the set of electrochemical cells while the substantially constant current is maintained through the set of electrochemical cells; (d) determining additional multiple differential capacity values from the additional multiple voltage readings; and (e) determining the variation in the minor total-impedance contributor based on the additional multiple differential capacity values. In some examples, the difference between the first temperature and the second temperature is at least about 10° C. In the same or other examples, the second temperature is selected such that one or more additional peaks, in the additional multiple differential capacity values, are more detectable than one or more peaks in the multiple differential capacity values determined while the set of electrochemical cells is at the first temperature.

Also provided is an apparatus for detecting a variation in a minor total-impedance contributor of a total impedance in a set of electrochemical cells. The apparatus comprises a current source configured to flow a substantially constant current through the set of electrochemical cells, a voltmeter configured to obtain multiple voltage readings from each electrochemical cell in the set of electrochemical cells while the substantially constant current is applied to the set of electrochemical cells, and a processing element configured to (a) determine multiple differential capacity values from the multiple voltage readings, and (b) determine the variation in the minor total-impedance contributor based on the multiple differential capacity values.

In some examples, the processing element is further configured to screen the set of electrochemical cells and associate the variation in the minor total-impedance contributor with one or more battery defects in the set of electrochemical cells. In the same or other examples, the processing element is further configured to identify one or more electrochemical cells in the set of electrochemical cells when the variation in the minor total-impedance contributor associated with each of the one or more electrochemical cells is above a threshold. For example, the threshold is one of an expected-value threshold and a mean-of-population threshold. Alternatively, the threshold is the mean-of-population threshold. The electrochemical cells are identified in the set of electrochemical cells when the variation in the minor total-impedance contributor associated with each of the one or more electrochemical cells is away from the mean-of-population threshold by at least a set Z-score.

Also provided is an apparatus for in-situ diagnostics of a set of electrochemical cells based on variation in a minor total-impedance contributor of a total impedance in the set of electrochemical cells. The apparatus comprises a battery charger configured to flow a substantially constant current through the set of electrochemical cells, a battery management system configured to obtain multiple voltage readings from each electrochemical cell in the set of electrochemical cells while the substantially constant current is applied to the set of electrochemical cells, and a processing element configured to (a) determine multiple differential capacity values from the multiple voltage readings, and (b) determine the variation in the minor total-impedance contributor based on the multiple differential capacity values.

These and other embodiments are described further below with reference to the figures.

DETAILED DESCRIPTION

In the following description, numerous specific details are outlined to provide a thorough understanding of the presented concepts. The presented concepts may be practiced without some or all these specific details. In other instances, well-known process operations have not been described in detail to not unnecessarily obscure the described concepts. While some concepts will be described in conjunction with the specific embodiments, it will be understood that these embodiments are not intended to be limiting.

Introduction

Figure 1:
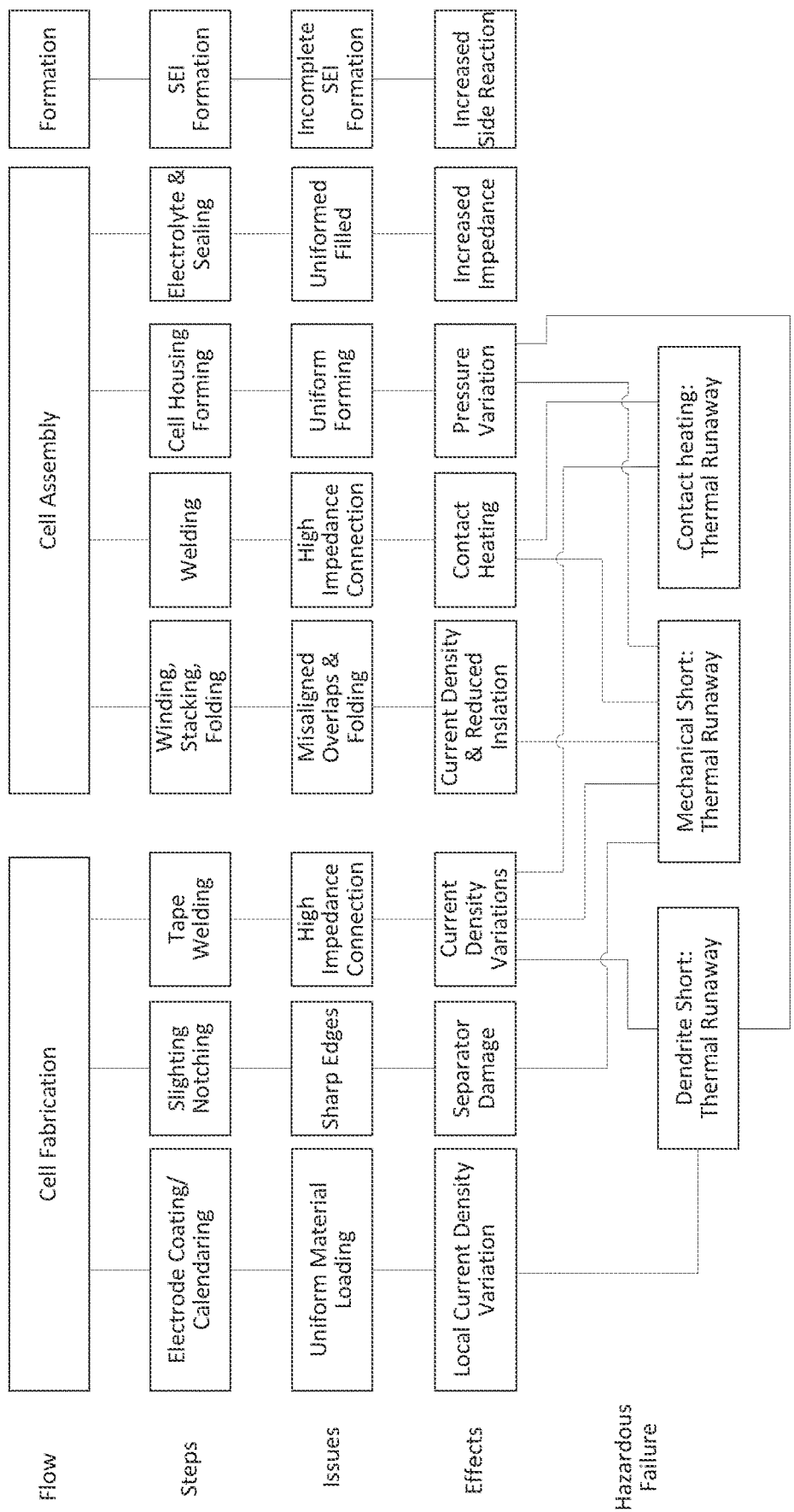
FIG. 1 is a block diagram illustrating different failure modes in electrochemical cells and assemblies formed using these cells, in accordance with some examples.

Failure modes of individual electrochemical cells, battery modules comprising multiple cells, and/or battery packs comprising multiple battery modules can take different forms. FIG. 1 illustrates some examples of these failure modes. Some failure modes are associated with very distinctive characteristics, while others are more subtle. For example, an imperfect tab connection (e.g., insufficient weld) can cause a measurable increase in the impedance of that particular tab, but the increase in the overall cell impedance can be hard to detect using conventional techniques (e.g., impedance spectroscopy, overvoltage assessment, and the like). Specifically, with multiple tabs connected in parallel, the low impedance of the many well-formed tab connections dominates the impedance and overvoltage behavior of a single imperfect tab connection as further described below making this imperfect tab connection particularly hard to detect.

Difficulties with determining poor tab connections are associated with finding the increased impedance of the defective tab connection in parallel with the many small impedances of each well-formed tab connection. For example, a typical impedance of the welded-tab connection, which is configured to support a 60 Amp current, is about 2 mOhm. When multiple tabs are connected in parallel and one of these tabs has an increased impedance (e.g., due to an imperfect weld), the tabs with a smaller impedance will dominate the total impedance. Table 1 table illustrates a representative model in which ten resistors are connected in parallel. Specifically, in Example 1, each of these ten resistors (R1-R10) has an impedance of 2 mOhm, yielding a total impedance of 0.2 mOhm. In Example 2, one of these ten resistors (R10) now has an impedance of 10 mOhm, while the remaining ones (R1-R9) are still at 0.2 mOhm. The total impedance is now 0.217 mOhm or 8.7% higher than that in Example 1. It should be noted that this change in the total impedance is minor although the impedance of R10 has increased by 400%.

TABLE 1

|  | Example 1 | Example 2 |
| --- | --- | --- |
| R1-R9 | 2 mOhm | 2 mOhm |
| R10 | 2 mOhm | 10 mOhm |
| R-total | 0.2 mOhm | 0.217 mOhm |
| Difference |  | 8.70% |

Table 2 table illustrates another representative model in which ten resistors are also connected in parallel but have different impedances. Referring to Example 1, each of the nine resistors (R1-R10) has an impedance of 2 mOhm, while one resistor (R10) has an impedance of 200 mOhm, yielding a total impedance of 0.221976 mOhm. Now, referring to Example 2, if R10 is increased by 400% to 1000 mOhm, the total impedance goes up to 0.222173 mOhm, a rise of only about 0.9%. In fact, if R10 is completely disconnected, which corresponds to an infinite impedance as shown in Example 3, the total impedance goes up to 0.222222 mOhm, a rise of only 0.11%. It should be noted that these impedance differences are in the order of tenths of micro-Ohms, which can be very difficult to detect and may require specialized equipment, which may not be always available. Furthermore, the impedance changes of one component can be easily masked by the impedance changes of another component, especially when the "masking" component has a significantly smaller starting resistance.

TABLE 2

|  | Example 1 | Example 2 | Example 3 |
| --- | --- | --- | --- |
| R1-R9 | 2 mOhm | 2 mOhm | 2 mOhm |
| R10 | 200 mOhm | 1000 mOhm | Infinite |
| R-total | 0.221976 mOhm | 0.222173 mOhm | 0.222222 mOhm |
| Difference |  | 0.09% | 0.11% |

In other words, it is difficult, if possible, at all to detect changes in the overall circuit impedance when these changes are caused by changes in the impedance of one (or very few) of many components that are connected in parallel, and/or when these one or more components (with the changed impedance) are higher impedance components than one or more other components connected in parallel. It should be noted that in parallel circuits, a higher number of interconnected components reduces the contribution of each component to the total impedance. Furthermore, the contribution to the total impedance is inversely proportional to the impedance of each component, $$\left(\frac{1}{R_{total}} = \sum_{1}^{N} \frac{1}{R_i}\right).$$

As such, the contribution (to the total impedance) of the most resistive component can be significantly less than that of the least resistive component. More specifically, determining a resistance change of the most resistive component in a parallel connection is very difficult when using a measurement of the total resistance. For purposes of this disclosure, a circuit component that has a contribution to the total impedance of less than 50%, is referred to as a minor total-impedance contributor. In other words, if a minor total-impedance contributor is completely disconnected from the circuit, the total impedance of the circuit will change by less than 50%. This minor total-impedance contribution can result from the component being one of many resistors connected in parallel (e.g., as illustrated in Table 3) and/or from having a larger impedance than other components, to which this component is connected in parallel (e.g., as illustrated in Table 4).

TABLE 3

|  | Example 1 | Example 2 |
| --- | --- | --- |
| R1 | 2 mOhm | 2 mOhm |
| R2 | 2 mOhm | 2 mOhm |
| R3 | 2 mOhm | 2 mOhm |
| R4 | 2 mOhm | Infinite |
| R-total | 0.5 mOhm | 0.666667 mOhm |
| Difference |  | 33.33% |

TABLE 4

|  | Example 1 | Example 2 |
| --- | --- | --- |
| R1 | 2 mOhm | 2 mOhm |
| R2 | 10 mOhm | Infinite |
| R-total | 1.666667 mOhm | 2 mOhm |
| Difference |  | 20.00% |

Figure 2A:
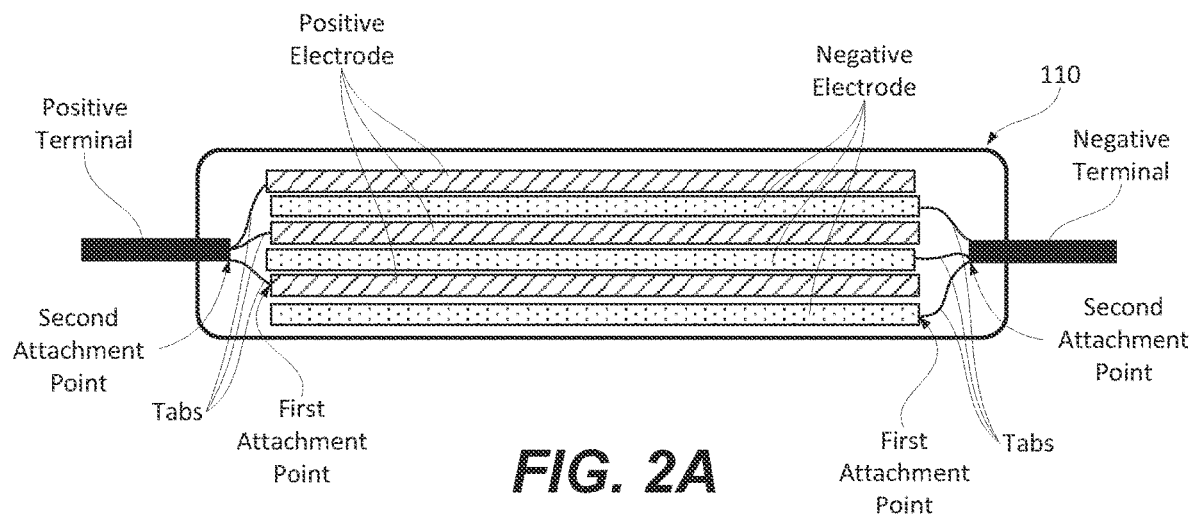
FIG. 2A is a schematic cross-sectional view of a stacked electrochemical cell illustrating various components of the cell, in accordance with some examples.
Figure 2B:
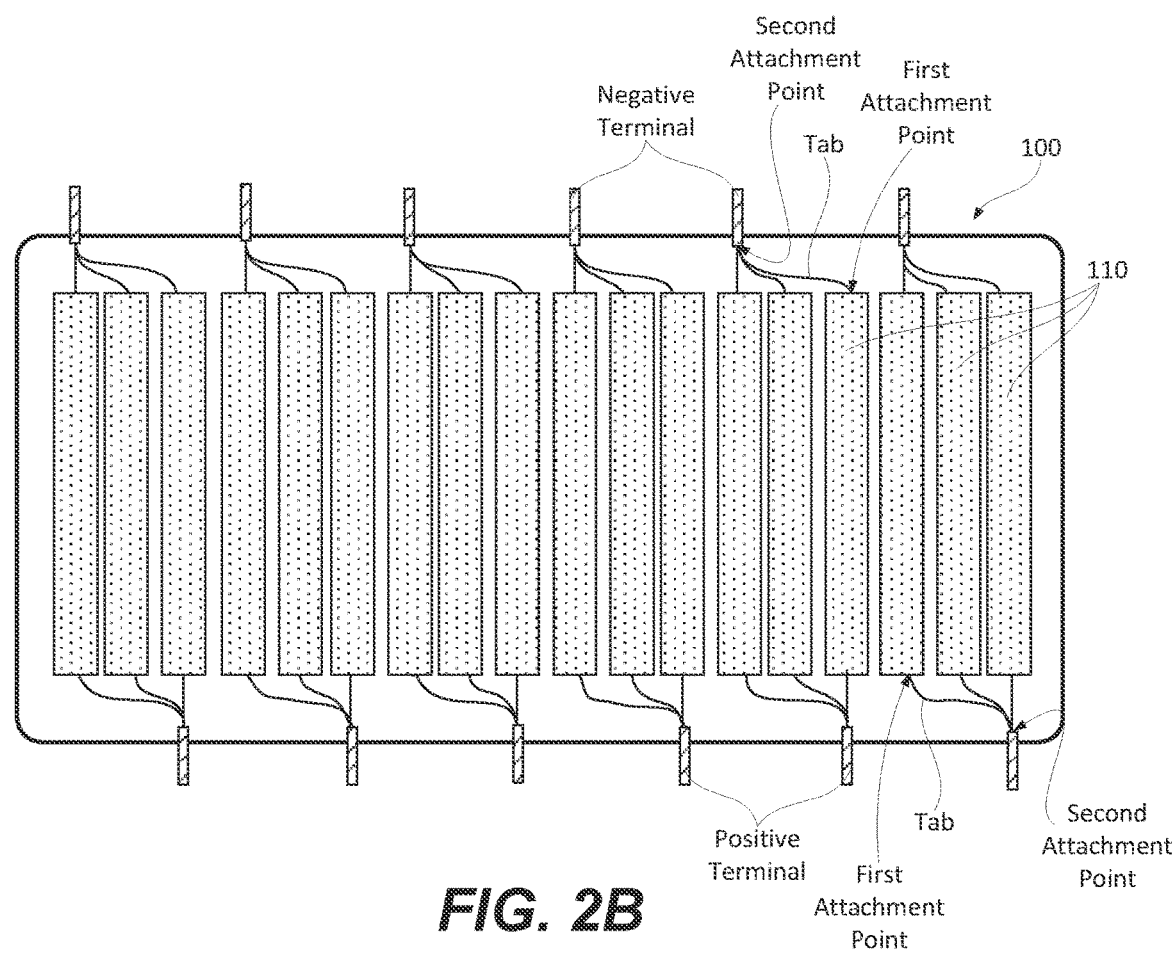
FIG. 2B is a schematic cross-sectional view of a battery assembly comprising multiple interconnected electrochemical cells, in accordance with some examples.

The circuit models described above with reference to Tables 1-4 are representative of electrochemical cells and various battery assemblies, which are formed using these cells, as will now be described with reference to FIGS. 2A and 2B. Specifically, FIG. 2A illustrates battery cell 100, which may also be referred to as a stacked cell. In this example, battery cell 110 comprises 3 positive electrodes and 3 negative electrodes. However, one having ordinary skill in the art would understand that any number of electrodes can be stacked together to form battery cell 110. Each electrode is connected to a separate tab, which is also connected to a corresponding one of the two cell terminals. In other words, this 3-electrode-pairs cell has 12 internal connections. Many modern stacked cells have up to 25 electrode pairs or even up to 50 electrode pairs, with corresponding numbers of various connections in the cells. Referring to FIG. 2A, it should be noted that all positive-electrode tabs are connected in parallel with each other. Similarly, all negative-electrode tabs are connected in parallel with each other. The connection between the positive-electrode tabs and the negative-electrode tabs is an in-series connection provided by the electrode stack. Furthermore, the two connections provided by each tab are in series connections. In other words, the overall connection scheme is a complex combination of mechanical, electrical, and electro-mechanical components. This complexity makes it very difficult to determine various failure modes using externally-obtained characteristics of battery cell 110 such as voltage (e.g., open-circuit voltage (OCV), constant-current voltage (CCV)), current, and the like.

Integrating electrochemical cells into a battery module only increases the complexity as will now be described with reference to FIG. 2B. Specifically, FIG. 2B illustrates battery assembly 110 comprising eighteen electrochemical cells 100. In addition to the internal connections formed within each cell, the cells are connected to the negative and positive terminals of the battery module.

Figure 2C:
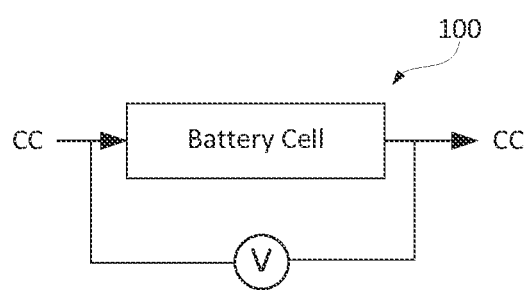
FIGS. 2C-2E are schematic illustrations of different testable unit examples.
Figure 2D:
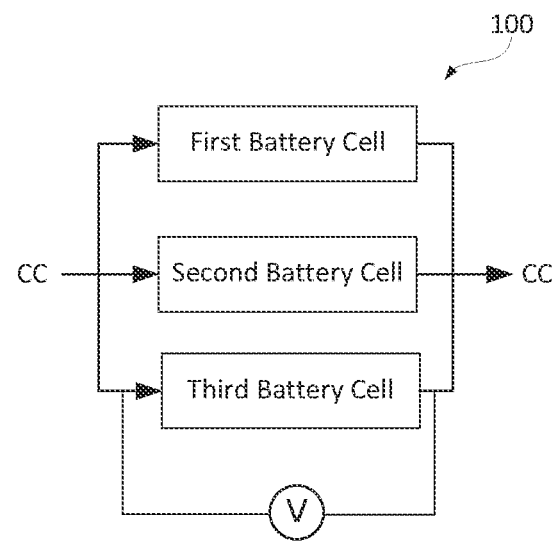
Figure 2E:
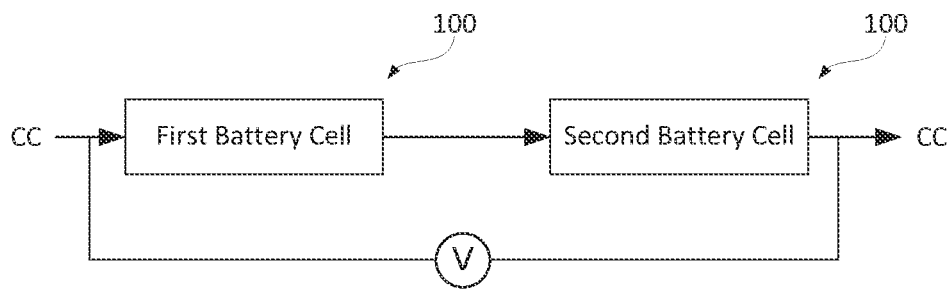

A testable unit within a battery module depends on the ability to control the operation of this unit (e.g., to maintain a substantially constant current) and on the ability to obtain various operating characteristics specific to this unit (e.g., voltage readings). In this disclosure, a testable unit may be referred to as a set of electrochemical cells. In some examples, this set includes only one cell, e.g., as schematically shown in FIG. 2C. In other examples, the set includes multiple cells, which can be interconnected in parallel (as, e.g., shown in FIG. 2D), in series (as, e.g., shown in FIG. 2E), or a combination of both interconnections.

Figure 2F:
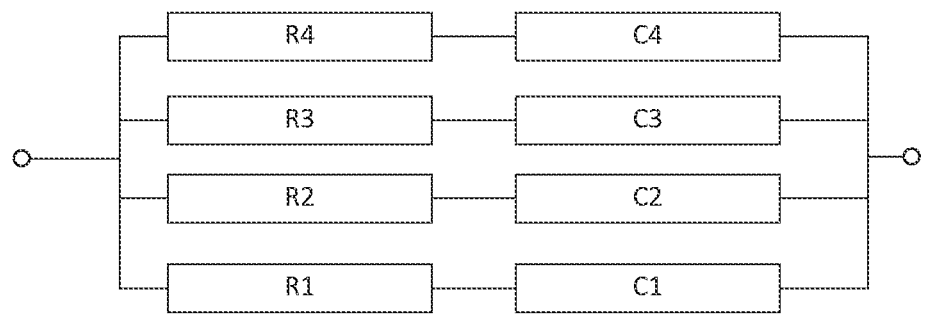
FIGS. 2F and 2G are graphical representations of a testable unit model and a corresponding characterization of this model using a differential-capacity approach.

As described above with reference to FIGS. 2A-2E, a set of electrochemical cells can be a complex combination of mechanical, electrical, and electrochemical features, each contributing to the total impedance of the set. Furthermore, as noted above with reference to Tables 1-4, some of these features can be modeled as individual resistors. Another model will now be described with reference to FIGS. 2F and 2G. Specifically, FIG. 2F is a model representing a testable unit comprising one or more electrochemical cells. This model is presented as a combination of partial capacities (C1, C2, C3, and C4) and partial impedances (R1, R2, R3, and R4). In this example, R1 is the lowest impedance, while R4 is the highest, i.e., R1<R2<R3<R4. The total capacity of this testable unit is the sum of the partial capacities (i.e., C-total=C1+C2+C3+C4). The partial capacities can have the following order C1>C4>C2, C3. One having ordinary skill in the art would recognize that various other examples are within the scope.

Figure 2G:
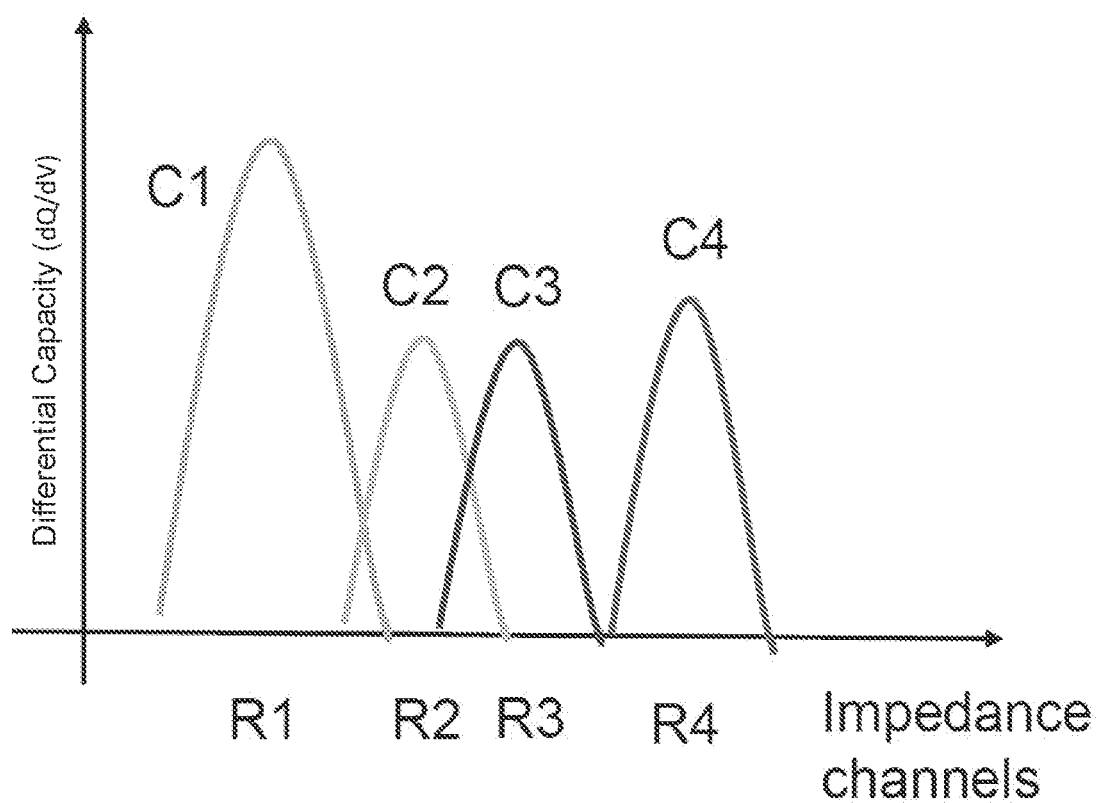

The current applied to the testable unit (modeled in FIG. 2F) will cause different over-voltages at different resistors, which will cause the separation of the capacity peaks corresponding to different partial capacities as, e.g., is schematically shown in FIG. 2G. Specifically, higher impedances will move corresponding partial capacities to the right as, e.g., is schematically shown in FIG. 2G. Specifically, the X-axis identifies different impedance channels, while the Y-axis identifies differential capacities (dQ/dV) values. FIG. 2G illustrates how differential capacities can be separated into distinctive impedance channels.

The integral of the Ohmic-specific capacities of the different impedance channels results in the partial capacities C1, C2, C3, and C4. It is important to note that the resistivity of the tabs is just one example of different characteristics that the described methods are capable of detecting. The methods can also be used to separate capacities accordingly to the electrolyte impedances, different activation impedances, or different diffusion impedances. In general, any impedance component of an electrochemical cell (e.g., a fuel cell, a battery cell, an analytical cell) or a capacity cell (a super-capacitor, a liquid capacitor, a solid-state capacitor) that is associated with a specific partial capacity component can be assessed by the methods described herein.

Processing Examples

Figure 3:
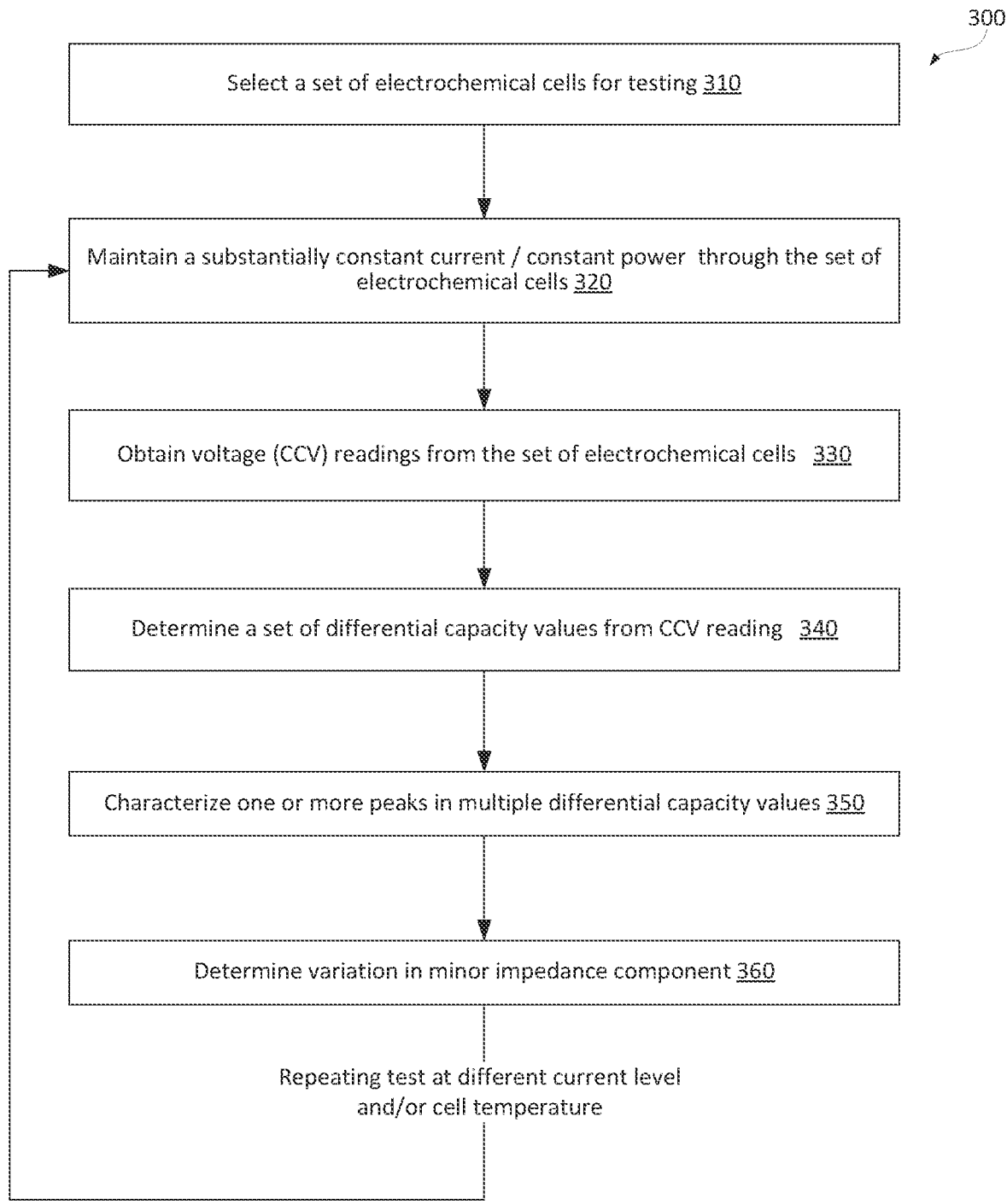
FIG. 3 is a process flowchart corresponding to a method of detecting a variation in the minor total-impedance contributor of the total impedance in the set of electrochemical cells, in accordance with some examples.

FIG. 3 is a process flowchart corresponding to method 300 of detecting a variation in the minor total-impedance contributor of the total impedance in the set of electrochemical cells 100, in accordance with some examples. For purposes of this disclosure, a minor total-impedance contributor is defined as a resistance whose changes (e.g., an increase) have a minor effect on the total resistance. The minor effect can be defined as a change to the total resistance of less than 10% when the changes in the minor total-impedance contributor are at least 100%. The minor total-impedance contributor can correspond to the resistance of a circuit element (e.g., a battery cell (or a component of a battery cell), a tab, and a weld, active material, or electrolyte) that is connected in parallel with other components as described above. Various examples and features of minor total-impedance contributors are described above with reference to FIGS. 2A-2G. Furthermore, various causes for this variation are shown in FIG. 1. Some notable examples include manufacturing errors, physical stresses applied to the cell and/or pack, and coefficient of thermal coefficient (CTE) mismatch with thermal cycling, non-uniform active material, non-uniform coating, non-uniform electrolyte thickness, and non-uniform electrolyte conductivity, e.g., any non-uniformity in electrochemical cells.

In some examples, method 300 comprises (block 310) selecting a set of electrochemical cells 100 for testing. This is an optional operation and, in some examples, all electrochemical cells 100 can be used in testing. For example, this test can be used during the fabrication of electrochemical cells 100 and/or battery packs assembled using electrochemical cells 100. In some examples, multiple sets of electrochemical cells 100 can be identified and tested in sequence. Furthermore, various other defects detection algorithms (e.g., based on current, voltage, and temperature data) of different cells in a pack in can be used to identify the cells for further testing in accordance with this method. For example, these other defect detection algorithms can identify a general problem with one or more cells, while the methods described herein can pinpoint the specific issue. For example, the set of electrochemical cells 100 can include one or more cells selected from a larger block of cells (e.g., a battery module or a battery pack). The remaining cells may not be tested and can be used for normal operations. For example, method 300 can be performed in situ (on the set of electrochemical cells 100) while a battery pack remains operational and supports the external charging/discharging demands. In some examples, further described below, this in situ testing can be performed on the individual cell level. Alternatively, testing is performed on a group of multiple cells, e.g., an entire battery module. Individual cells in the tested battery module can be interconnected in accordance with the various connection schemes described above. In general, testing is performed on a testable unit, which depends on the ability to control the operation of this unit (e.g., to maintain a substantially constant current) and also on the ability to obtain various operating characteristics specific to this unit (e.g., voltage readings).

Method 300 proceeds with (block 320) maintaining a substantially constant current (or a substantially constant power) through the set of electrochemical cells 100. For purposes of this disclosure, the term "substantially" can be defined as no more than 25% of the peak-to-peak current variation or, more specifically, no more than 20%, no more than 15%, or even no more than 10%.

In some examples, the substantially constant current is selected such that a product of the substantially constant current and the (expected) minor total-impedance contributor is greater than a threshold set by a voltmeter (used for obtaining the multiple voltage readings in a later operation). For example, the threshold can be set by the desired width or distance of an impedance channel. For example, if a higher resolution is needed, the current can be increased to create an increased voltage differentiation from impedance to the other. Another consideration is the ability to differentiate from the main peak, provided by the major total-impedance contributor. For example, if the minor total-impedance contributor is expected to be 1 mOhm and the constant current is set to 50 A, the impedance peak is 50 mV. Of course, the current can be limited by the design of the tested unit (e.g., the size/current rating of cells, the connection among multiple cells, and the like).

For example, the total impedance is determined by a minor total-impedance contributor and a major total-impedance contributor, e.g., as a combination of these contributors corresponding to the circuit design (e.g., in-series connections, parallel connections). In more specific examples, the minor total-impedance contributor is attributed to a first portion of the set of electrochemical cells, while the major total-impedance contributor is attributed to a second portion of the set of electrochemical cells, connected in series with the first portion. IN this example, the total impedance is at least in part a sum of the minor total-impedance contributor and the major total-impedance contributor. It should be noted that differentiating of minor total-impedance contributors can be difficult because of their minor impact to the total impedance. Various methods and systems described herein are specifically configured to enable this differentiation.

Figure 4A:
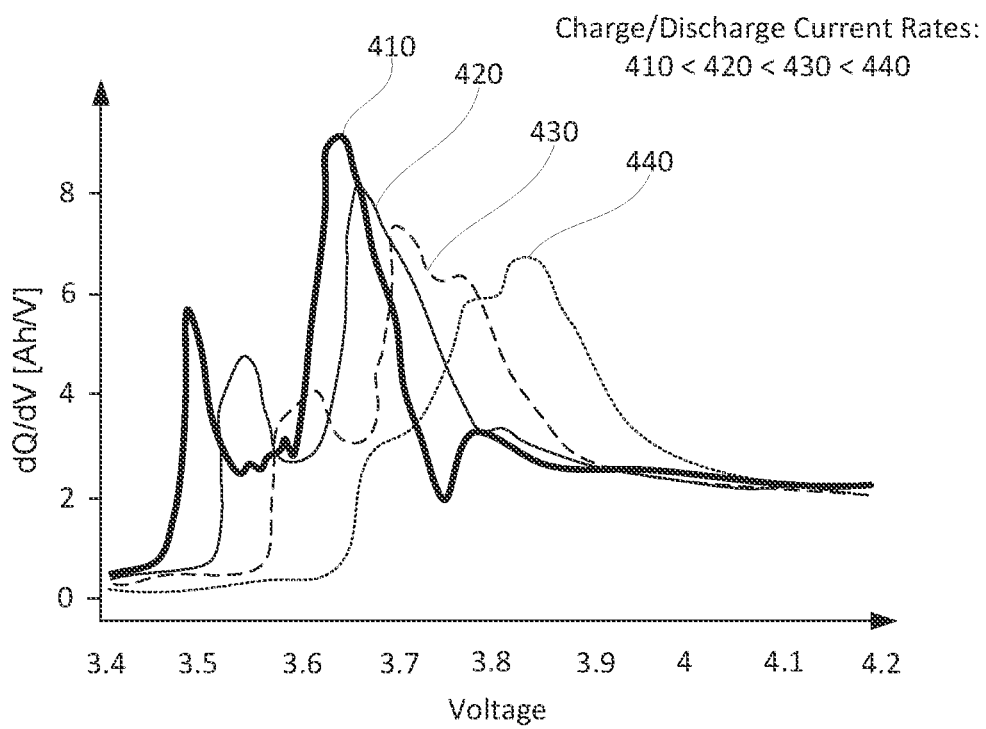
FIGS. 4A and 4B are different examples of differential capacity plots.

Different constant current rates produce different differential capacity profiles as will now be described with reference to FIG. 4A. Specifically, FIG. 4A illustrates four differential capacity profiles obtained from the same cell at different constant-current rates. Line 410 corresponds to the smallest current. Line 420 corresponds to a higher current, while line 430 corresponds to an even higher current. Finally, line 440 corresponds to the highest current among these four. In this example, the current ranged from C/6 up to C/2. A higher current (line 440) causes the largest voltage to spread (which is evidenced by the widest and shortest peak) due to the higher over-voltages of one or more impedance components (e.g., Ohmic, activation, and/or diffusion components). As such, the capacity peaks of each electrochemical reaction are also broadened.

Figure 4B:
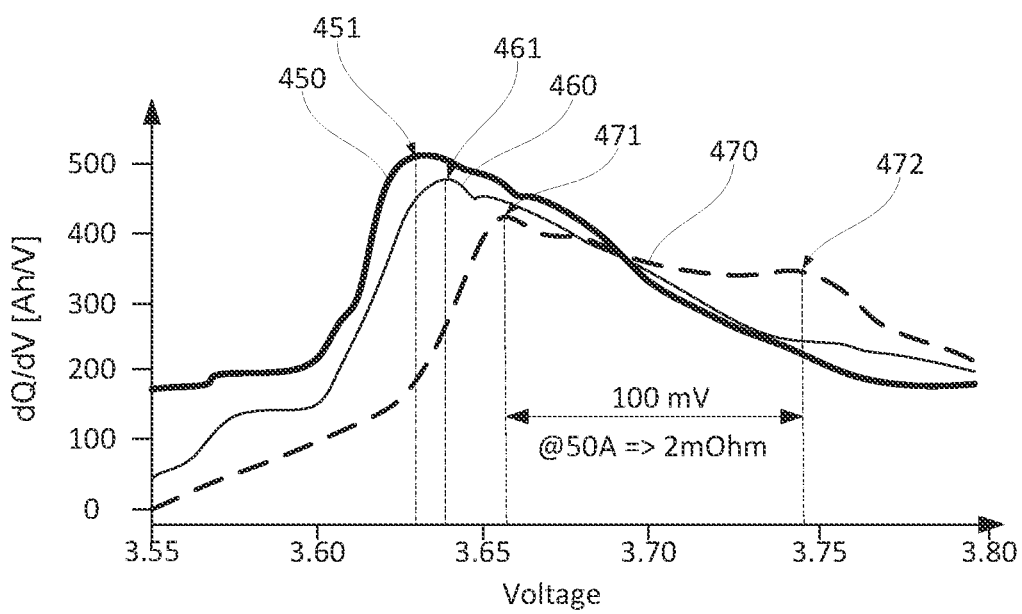

FIG. 4B illustrates another example of three profiles differential capacity profiles (line 450, line 460, and line 470). In this example, each of the two profiles (line 450 and line 460) has a single peak (point 451 and point 461), while the third profile (line 470) has a dual-peak profile (points 471 and 472). Considering the difference between these peaks (points 471 and 472) of 100 mV and the test current of 50 A, the impedance was estimated at 2 mOhm. It should be noted that the single-peak profiles (line 450 and line 460) do not allow perform a similar impedance analysis.

Figure 4C:
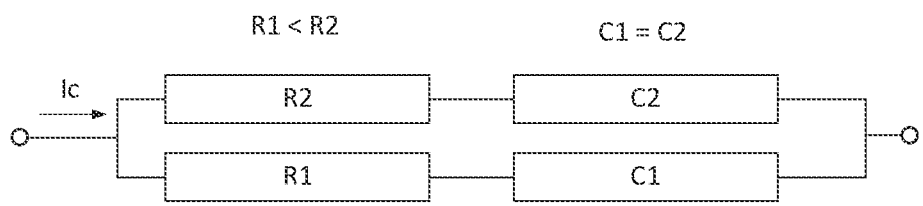
FIGS. 4C and 4D are graphical representations of a testable unit model and a corresponding characterization of this model using an Ohmic-specific differential-capacity algorithm.
Figure 4D:
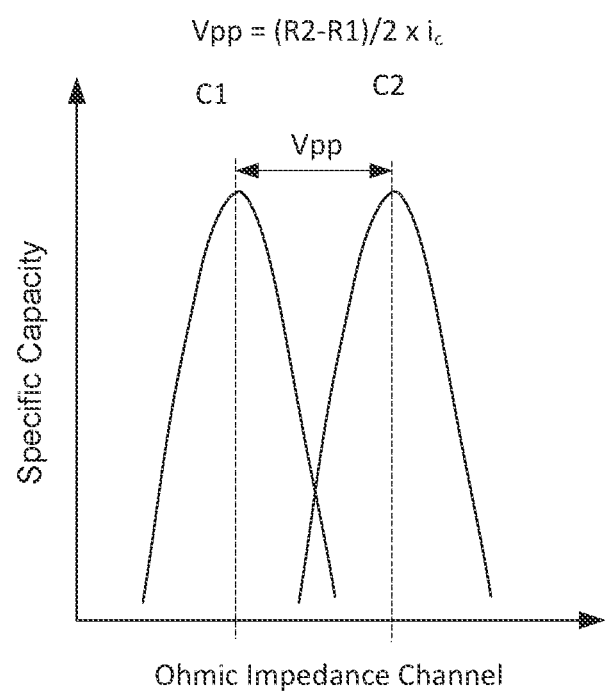

FIGS. 4C and 4D are graphical representations of a testable unit model and a corresponding characterization of this model using an Ohmic-specific differential-capacity algorithm. In this characterization, the Ohmic losses (Vpp) are proportional to the cell current ($i_c$) and the impedance channels can be differentiated using the following formula:

$$Vpp = (R2-R1)/2 * i_c$$

Figure 4E:
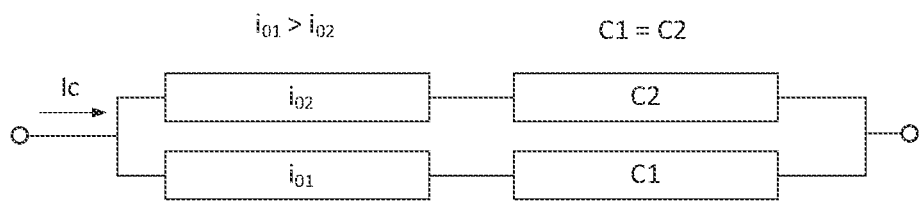
FIGS. 4E and 4F are graphical representations of a testable unit model and a corresponding characterization of this model using an activation current-based differential-capacity algorithm.
Figure 4F:
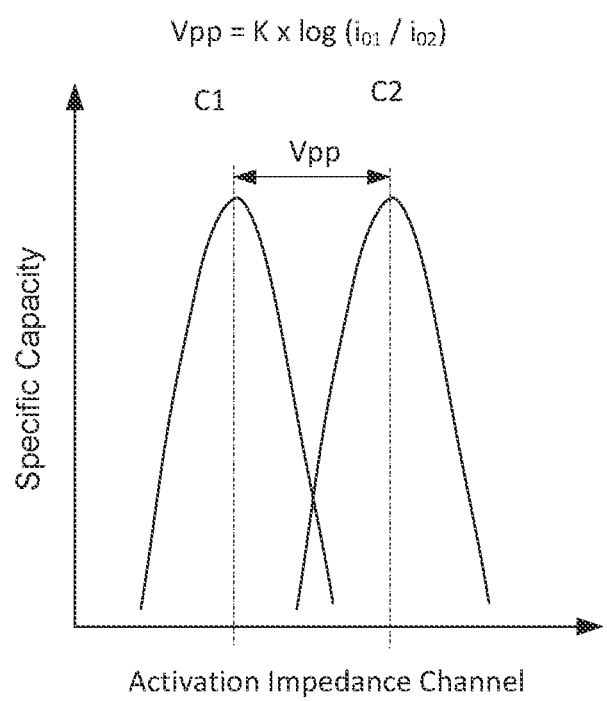

FIGS. 4E and 4F are graphical representations of a testable unit model and a corresponding characterization of this model using an activation current-based differential-capacity algorithm. Exchange currents passing through the corresponding modeled "resistors" can be estimated by the following formulas:

$$(E_2-E_0) = RT/k * \log k2ic - RT/k * \log i_{02}$$

$$(E_1-E_0) = RT/k * \log k1ic - RT/k * \log i_{01}$$

In this example, the activation loss (Vpp) is dependent on $\log (i_{o1}/i_{o2})$ and can be expressed as follows:

$$Vpp = K * (\log i_{o\,1} / i_{o\,2})$$

Figure 4G:
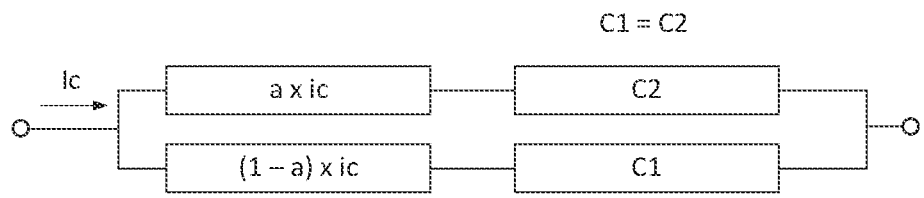
FIGS. 4G and 4H are graphical representations of a testable unit model and a corresponding characterization of this model using a current-density current-based differential-capacity algorithm.
Figure 4H:
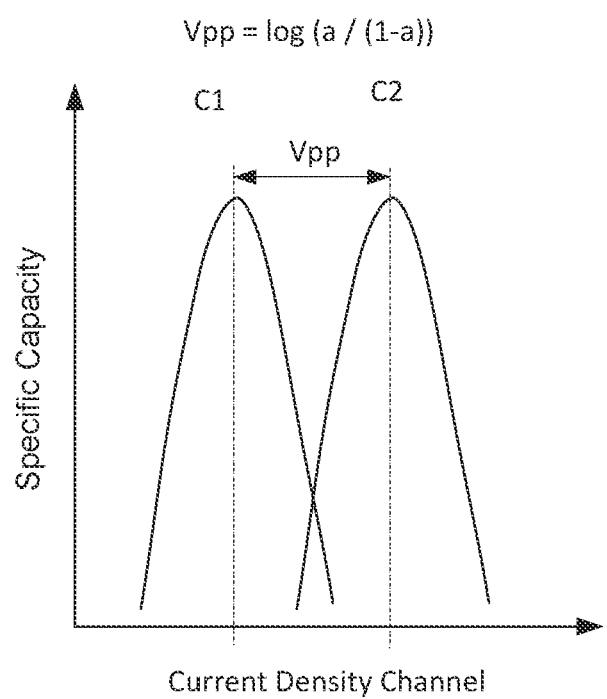

FIGS. 4G and 4H are graphical representations of a testable unit model and a corresponding characterization of this model using a current-density current-based differential-capacity algorithm, which can be represented by:

$$(E_2-E_0) = RT/k * \log ic/2 - RT/k * \log i_{o\,2}$$

$$(E_1-E_0) = RT/k * \log ic/2 - RT/k * \log i_{o\,1}$$

Referring to FIG. 4G, the current densities are $a*ic$ through C2 and $(1-a)*ic$—through C1. As such, Vpp is dependent on the nonuniform current densities $\log(a/(1-a))$ and can be expressed by the formulas:

$$Vpp = K \log a/(1-a)$$

When low currents or, more specifically, when low current densities are used, the highest definition of the peaks is achieved as, e.g., shown with line 410. However, narrowing the peak may not provide enough separation between multiple adjacent peaks, corresponding to different electrochemical reactions. As such, differentiation between different peaks (and different electrochemical reactions) may not be possible. In other words, while low currents enable clearer identification of one peak corresponding to one electrochemical reaction of the tested unit and provide an aggregate characterization of the tested unit, these low currents are less able to isolate one electrochemical reaction from another and the component associated with each reaction. At the same time, the description of Tables 1-4 above illustrates that variations in one component (e.g., variations in a minor total-impedance contributor) can be easily masked by other components. The selected current level can be based on the current ratings of the tested cells. For example, typical lithium-ion energy cells can be tested using currents that are between C/5 and C/2 or, even more specifically, between C/4 and C/3. For high-rate/power lithium-ion cells, designed to operate at higher C rates, the selected test current can be between C/2 and 1C.

Method 300 proceeds with (block 330) obtaining multiple voltage readings from the set of electrochemical cells 100 while the substantially constant current is maintained through the set of electrochemical cells 100. Table 5 illustrates one such example for a constant current of 100 A. It should be noted that some variations of the current are acceptable during this operation and can be used in further analysis. Furthermore, it should be noted that Table 5 provides only an illustrative example of voltage readings obtained during this operation.

TABLE 5

| Time [sec] | Current [A] | Voltage [V] |
|---|---|---|
| 0 | 100 | 3.600 |
| 60 | 101 | 3.605 |
| 120 | 99 | 3.609 |
| 180 | 100 | 3.611 |
| 240 | 100 | 3.613 |
| 300 | 100 | 3.615 |
| 360 | 100 | 3.618 |
| 420 | 100 | 3.624 |
| 480 | 100 | 3.628 |
| 540 | 102 | 3.632 |
| 600 | 98 | 3.635 |
| 660 | 100 | 3.638 |

In some examples, one or more peaks of differential capacity values (determined from these multiple voltage readings) are associated with phase transitions of active materials in an electrochemical cell. For example, phase transitions of layered oxides (e.g., nickel-manganese-cobalt (NMC)-based positive active materials) are around 3.7-3.8V. As such these primary peaks may be also referred to as phase transition peaks. It should be noted that these phase transition peaks (primary peaks) are different from secondary peaks, which may be caused by poor contacts and other issues, e.g., identified in FIG. 1. In some examples, the multiple voltage readings are obtained from the set of electrochemical cells when the state of charge (SOC) of the electrochemical cells is within the range associated with the phase transition peaks of active materials. For example, the method may involve determining a double peak. A lower current can produce a single peak corresponding to the material phase transition. At a higher current (that depends on the power ratings of the cell), this single phase-transition peak can separate into a double peak. This double peak corresponds to different impedances associated with the partial capacities of the phase transition. Specifically, the peak voltage separation in the double peak is proportional to the current and impedance difference. Therefore, the impedance channels can be defined based on the voltage difference of the partial capacitance of one phase transition.

Method 300 proceeds with (block 340) determining multiple differential capacity values from the multiple voltage readings. Specifically, each differential capacity value can be calculated based on the total charge (i.e., a product of the constant current and time added to or removed from the set of electrochemical cells 100 divided by the measured constant-current voltage (CCV) difference). One illustrative example of differential capacity values determined from the voltage values is shown in Table 6. Voltage pinning is essentially the process of finding the double peaks and voltage separation of the peaks.

TABLE 6

| Time [sec] | Current [A] | Voltage [V] | Voltage bin [V] | Charge [A*sec] | Differential Capacity [Ah/V] |
|---|---|---|---|---|---|
| 0 | 100 | 3.600 | 3.600-3.610 | 18,000 | 500 |
| 60 | 101 | 3.605 | 3.600-3.610 | | |
| 120 | 99 | 3.609 | 3.600-3.610 | | |
| 180 | 100 | 3.611 | 3.610-3.620 | 24,000 | 667 |
| 240 | 100 | 3.613 | 3.610-3.620 | | |
| 300 | 100 | 3.615 | 3.610-3.620 | | |
| 360 | 100 | 3.618 | 3.610-3.620 | | |
| 420 | 100 | 3.624 | 3.620-3.630 | 12,000 | 334 |
| 480 | 100 | 3.628 | 3.620-3.630 | | |
| 540 | 102 | 3.632 | 3.630-3.640 | 18,000 | 500 |
| 600 | 98 | 3.635 | 3.630-3.640 | | |
| 660 | 100 | 3.638 | 3.630-3.640 | | |

Method 300 proceeds with (block 350) characterizing one or more peaks in multiple differential capacity values (as a function of voltages). Various techniques for determining the peaks are within the scope. For example, second-order differential capacity ($d^2Q/dV^2$) values can be used to identify the peaks in multiple differential capacity values. Specifically, switching the sign in the set of second-order differential capacity values (e.g., from positive to negative) corresponds to the peak in the differential capacity values. It should be noted that these second-order differential capacity ($d^2Q/dV^2$) values represent slopes in the differential capacity values obtained in the previous operation.

In another example, a differential-capacity profile (formed using the multiple differential capacity values) is compared to one or more test/reference profiles to determine any deviations. For example, these test/reference profiles can include profiles for various values of minor total-impedance contributors. In this example, the process of characterizing one or more peaks in multiple differential capacity values involves profile fitting.

In yet another example, a differential capacity profile can be compared to other differential capacity profiles in the same module or pack or to the mean of their differential capacity profiles so that an outlier can be more readily identified. Furthermore, certain profile areas can be attributable to the known components of the tested unit (e.g., active materials on electrodes) to gain further insight into the root cause of any outlier profile. Specifically, when active materials are known, then the phase transition voltages can be also determined. This information can be used to identify the sharpest phase transition locations. A sharper peak is associated with a fast phase transition reaction.

Method 300 proceeds with (block 360) determining the variation in the minor total-impedance contributor based on one or more peaks. For example, the voltage difference between two adjacent peaks and the constant current value can be used to determine an increase in impedance: $R_n - R_m = (V_{Peak\ n} - V_{Peak\ m}) * I$ charge, where $R_n$—represents the impedance of one impedance channel with the first partial capacity, $R_m$—is another impedance channel with the second partial capacity, $V_{Peak\ n}$—a voltage associated with the primary peak of the first partial capacity, $V_{Peak\ m}$—a voltage associated with a secondary peak of the second partial capacity, and I—the charge or discharge current used for testing. This impedance difference ($R_n - R_m$) is a quantitative measure of non-uniformity in the tested electrochemical cell (or a group of cells). Some examples of such non-uniformities are Ohmic impedances (e.g., due to non-uniform welding), particle size distribution and/or activation impedance of the active materials, coating thicknesses/densities, electrode conductivities, electrolyte conductivities, cell pressurization, and the like. Specifically, the impedance difference ($R_n$–$R_m$), obtained using the method described above, correlates to one or more non-uniformities. In some examples, the test parameters (e.g., current, temperature) are specifically selected to determine particular non-uniformities. Overall, the correlation exists because any such non-uniformity results in nonuniform impedances that cause peak splitting of the electrochemical reactions (e.g., transition reactions). These impedance differences (with respect to, e.g., temperature, current, and/or pressure) allow the differentiation of various kinds of cell nonuniformity as described in FIGS. 4C to 4G.

Furthermore, the quantitative measure of cell nonuniformities enables cell screening for various quality characteristics. This screening can be performed after the fabrication of cells and can be used to identify issues on manufacturing lines (e.g., non-uniform coating, issues with presses/calendaring tools, issues with mixing/particle distributions within electrode layers, and the like. Furthermore, these methods can detect cell degradation over the cycle life. For example, some cell degradation mechanisms cause non-uniformities within cells, e.g., pressure built up, activation, Ohmic contacts of the active material, solid electrolyte interface (SEI) formation, and the like. The quantitative detection and measure of such degradation modes can be useful to identify such failure modes early on and potentially mitigate them during the cycle life.

It should be noted that these methods can be also applied to a group of cells such as battery modules and battery packs. Specifically, these methods can be used to measure the non-uniformity of harness impedances, pack pressure, temperature as well as a current distribution which can be used for a quality check as well as degradation behavior.

In some examples, method 300 is repeated using a different level of the substantially constant current and/or temperatures. As noted above with reference to FIG. 4A, a lower current produces a more distinctive primary peak (e.g., a higher peak) but produces less separation between multiple peaks for a set impedance value. As such, in some examples, a secondary peak can potentially merge with the primary peak and cannot be easily identified. On the other hand, a higher current widens the primary peak making it less distinctive. Specifically, method 300 proceeds with maintaining an additional substantially constant current through the set of electrochemical cells 100. The additional constant current is different from the constant current used in the previous test. For example, the difference between the additional constant current and the constant current (used in the previous test) can be at least about 10%, at least about 20%, at least about 30%, or even at least about 50%. In some examples, the additional constant current is smaller than the constant current (used in the previous test). Alternatively, the additional constant current is larger than the constant current (used in the previous test). For example, the initial testing may not reveal any double peaks. In this case, the test current can be increased, and the method is repeated until double peaks are identified. Furthermore, the test may be repeated when one or more non-uniformity issues in the cell are known. The effects of the temperature on the detectability of peaks are described below.

Temperature Dependence

The activation impedance is temperature-dependent. Specifically, the activation impedance tends to decrease as the temperature of the cell increases due to the Arrhenius behavior of electrochemical reactions. On the other hand, the contact impedance is less dependent on the temperature, and this dependence (if any) is inverse to that of the activation impedance. Specifically, the contact impedance tends to increase as the cell temperature increases due to the decreased mobility of electrons in metals.

The temperature dependence can also be described from another perspective, e.g., a model in which two resistors are connected in series. The first resistor represents a metal tab's impedance, while the second resistor represents the contact resistance. The decreased mobility of electrons in metals increases the impedance of the metal tab (i.e., the first resistor in the above model) not the contact itself (i.e., the second resistor). Assuming the even temperature change for all tabs, an equal change in impedance will result, which means that there would be no change in the differential capacity peak. It should be noted that the impedance of the actual weld itself follows another mechanism. Without being restricted to any particular theory, it is believed that the contact impedance will decrease with increasing temperature because the rising temperature increases true contact area by softening the metals, thereby reducing contact impedance.

In some examples, a decreased activation impedance represents a faster electrochemical reaction, resulting in a sharper peak of the transition and, therefore, an increased sensitivity to detect minor impedances. For example, at a lower temperature and lower test current, the double peak may not appear because the impedance difference between the two impedance channels is too small. Increasing, the test current can broaden the peaks, which may cause the overlap of double peaks. This overlap can interfere with peak detection or, more specifically, with the differentiation of two impedance channels. However, increasing the temperature causes the reaction peak to be much sharper at higher test currents, which helps with this differentiation of the two impedance channels.

In some examples, a method for detecting the variation in the minor total-impedance contributor is performed at different temperatures, e.g., with the temperature difference between each pair of tests being at least 5° C., at least 10° C., at least 20° C., and even at least 40° C. The temperature may be controlled so that testing may be performed at the desired cell temperature or the testing may be performed opportunistically when the desired cell temperature exists. It should be noted that many battery applications can expose cells to different temperatures due to ambient temperature variations, cell heating due to charge/discharge, and the like. Furthermore, some battery packs are equipped with active heating-cooling systems. Finally, many battery packs are equipped with temperature monitoring devices. In some examples, these temperature monitoring devices are capable of differentiating the temperatures of individual cells.

It should be noted that testing the cells at low temperatures causes the activation impedance to dominate the cell impedance. This allows the assessment of the minor activation impedance of the cell or the module assembly. At higher temperatures, the ohmic contact impedance may dominate the cell impedance, allowing the ohmic contact impedance to be assessed. Finally, it should be noted that any test comparisons are performed at substantially the same temperatures.

Additional Pack Examples

Figure 5:
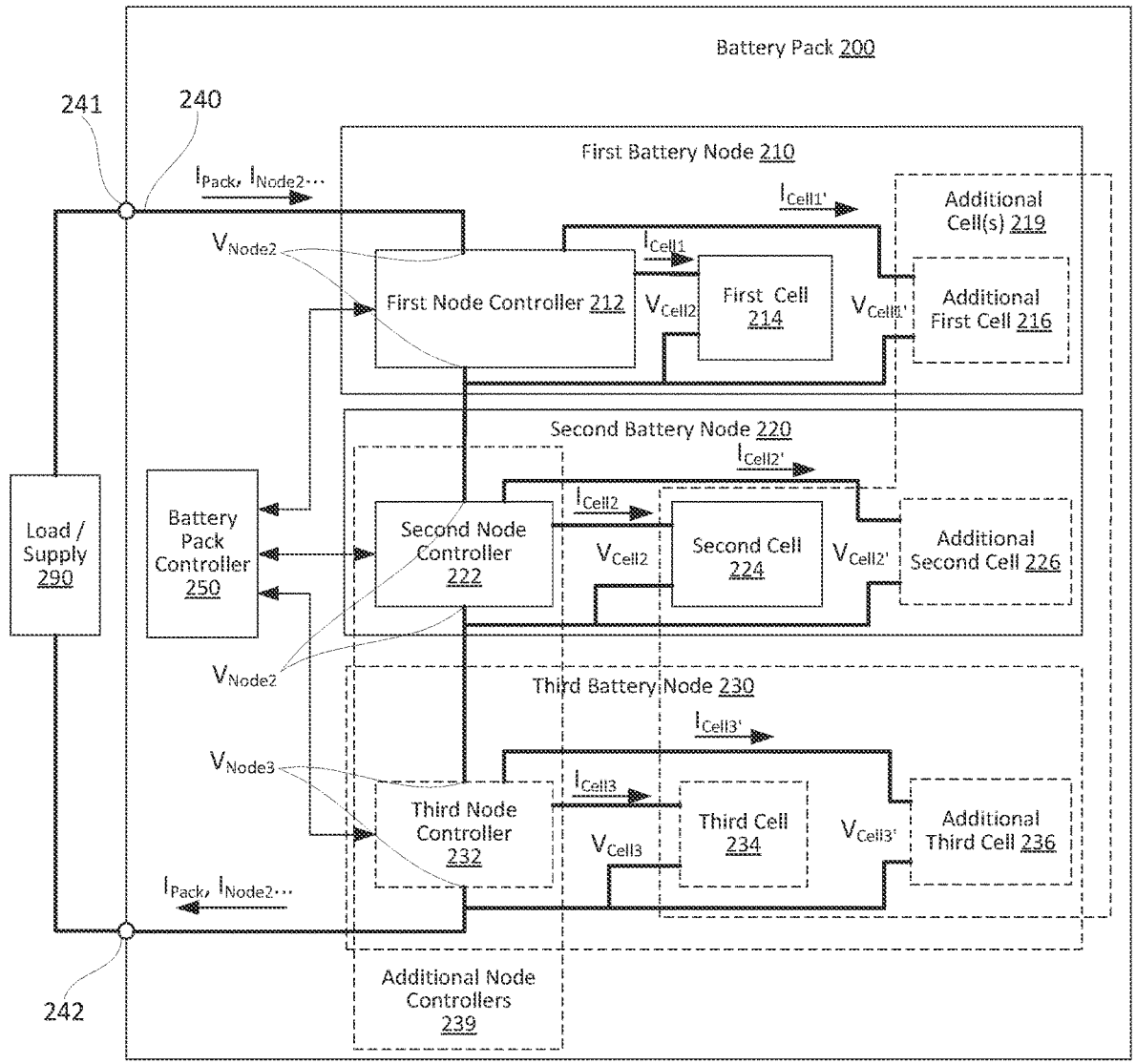
FIG. 5 is a block diagram of a battery pack, in accordance with some examples.

FIG. 5 is a schematic illustration of one example of battery pack 200. Battery pack 200 comprises at least two battery nodes, e.g., first battery node 210 and second battery node 220. In some examples, battery pack 200 comprises one or more additional battery nodes, such as third battery node 230. Each battery node comprises a node controller and at least one battery cell, e.g., first battery node 210 comprises first node controller 212 and first cell 214, second battery node 220 comprises second node controller 222 and second battery cell 224, and third battery node 230, when present, comprises third node controller 232 and third battery cell 234. Multiple node controllers are connected in series (shown) and/or parallel by bus 240. The ends of bus 240 are coupled to form battery pack terminals, such as first battery pack terminal 241 and second battery pack terminal 242. During the operation of battery pack 200, load/supply 290 is connected to the battery pack terminals to supply power to battery pack 200 and/or to receive power from battery pack 200.

Referring to FIG. 5, in some examples, at least one battery node comprises one or more additional cells, which are optional. For example, first battery node 210 is shown with additional first cell 216, independently connected to and controlled by first node controller 212. Similarly, second battery node 220 is shown with additional second battery cell 226, and third battery node 230 is shown with additional third battery cell 236. In general, each battery node comprises any number of battery cells, e.g., one, two, three, four, or more connected in parallel, as shown in FIG. 5, in series, or in a series-parallel combination.

As such, other cells in battery pack 200 may be referred to as additional battery cells 219. These additional battery cells 219 are used to compensate for any power output variations associated with first cell 214 during its testing, e.g., using first node controller 212 and/or other node controllers. For example, the cell(s)/node(s) under test are driven with the constant current or power while one or more additional node controllers provide power compensation from their respective cells as needed to service load 290. The operation of additional battery cells 219 is performed using one or more additional node controllers 239 (e.g., second node controller 222 and third node controller 232) in FIG. 5. These additional node controllers 239 are connected in series with each other and with first node controller 212, at least in the example shown in FIG. 5.

Referring to FIG. 5, battery pack 200 also comprises battery pack controller 250, which is communicatively coupled to each node controller and controls the operation of each node controller. For example, battery pack controller 250 instructs first node controller 212 to charge or discharge first cell 214 at a constant current. Battery pack controller 250 is also configured to maintain the power output of battery pack 200 such that this power output and/or the pack voltage is not impacted by various operations of method 300.

In some examples, battery pack 200 is operable as an apparatus for detecting a variation in a minor total-impedance contributor of a total impedance in a set of electrochemical cells, e.g., first cell 214, additional first cell 216, second additional cell 224, second additional cell 224, third cell 234, and/or third additional cell 236. The apparatus may comprise a current source (e.g., load/power supply 290) configured to flow a substantially constant current through the set of electrochemical cells. In some examples, the substantially constant current is provided by one or more of the node controllers (e.g., the current through load/power supply 290 can vary, while the combination of node controllers ensures that the tested cells see the substantially constant current during the test duration. The apparatus may also include a voltmeter (e.g., embedded into a node controller) configured to obtain multiple voltage readings from each electrochemical cell in the set of electrochemical cells while the substantially constant current is applied to the set of electrochemical cells. The apparatus also comprises a processing element (e.g., battery pack controller 250 and/or node controllers) configured to (a) determine multiple differential capacity values from the multiple voltage readings, and (b) determine the variation in the minor total-impedance contributor based on the multiple differential capacity values. Additional operational aspects of the processing element are described above with reference to FIG. 3. For example, the processing element can be further configured to screen the set of electrochemical cells and associate the variation in the minor total-impedance contributor with one or more battery defects in the set of electrochemical cells. In some examples, the processing element is further configured to identify one or more electrochemical cells in the set of electrochemical cells when the variation in the minor total-impedance contributor associated with each of the one or more electrochemical cells is above a threshold. For example, the threshold is one of an expected-value threshold and a mean-of-population threshold. In the specific example, the threshold is the mean-of-population threshold. The one or more electrochemical cells are identified in the set of electrochemical cells when the variation in the minor total-impedance contributor associated with each of the one or more electrochemical cells is away from the mean-of-population threshold by at least a set Z-score.

Also provided is an apparatus (e.g., battery pack 200) for in-situ diagnostics of a set of electrochemical cells based on variation in a minor total-impedance contributor of a total impedance in the set of electrochemical cells. The apparatus comprises a battery charger (e.g., power supply 290), which is configured to flow a substantially constant current through the set of electrochemical cells. The apparatus also comprises a battery management system (e.g., battery pack controller 250), which is configured to obtain multiple voltage readings from each electrochemical cell in the set of electrochemical cells while the substantially constant current is applied to the set of electrochemical cells. The apparatus also comprises a processing element (e.g., a part of battery pack controller 250), and/or node controllers), which is configured to (a) determine multiple differential capacity values from the multiple voltage readings, and (b) determine the variation in the minor total-impedance contributor based on the multiple differential capacity values. For example, the processing element can be further configured to associate the variation in the minor total-impedance contributor with one or more battery defects in the set of electrochemical cells. In some examples, the processing element is further configured to provide a warning to an operator of the apparatus once one or more battery defects are associated with the set of electrochemical cells. In some examples, the set of electrochemical cells is entirely replaceable or a subset of electrochemical cells in the set of electrochemical cells is replaceable once one or more battery defects are associated with the set of electrochemical cells. The processing element can be further configured to control the battery charger and a current level flown through the set of electrochemical cells.

Application Examples

It is desirable to detect variations in minor total-impedance contributors in individual electrochemical cells and various sets of electrochemical cells in a variety of applications. For example, certain manufacturing defects introduced in the fabrication of electrochemical cells, such as a single defective tab connection in a multi-layer cell, may be obscured by the many lower impedance defect-free connections to the tabs of parallel layers. Similarly, the extra impedance introduced by an imperfection in one of the many welds in a multi-cell battery module or pack may be obscured by the lower impedance of well-formed welds in parallel cells. Even if the additional minor total-impedance does not appreciably increase the overall impedance of the cell, module, or pack, it could impact performance, lifetime, or safety.

Figure 6:
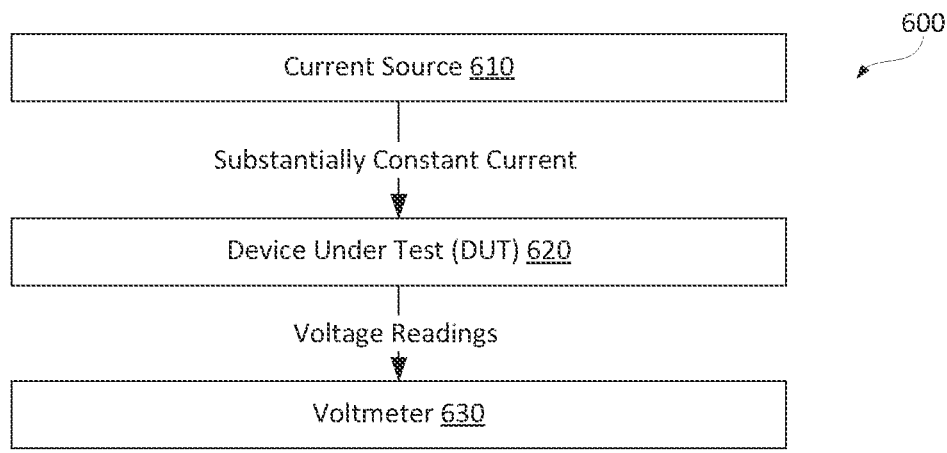
FIG. 6 is a block diagram of an in-factory screening system for detecting a variation in the minor total-impedance contributor of the total impedance in the set of electrochemical cells, in accordance with some examples.

In some examples, method 300 of FIG. 3 may be used during manufacturing testing to identify outlier minor total-impedance profiles to screen defects. FIG. 6 shows an example of in-factory screening system 600 comprising current source 610, which forces a substantially constant current through the device under test (DUT) 620. Current source 610 may be implemented, for example, by a power supply and an electronic load. DUT 620 may be a single electrochemical cell or a grouping of electrochemical cells such as a battery module or complete battery pack or battery rack. Voltmeter 630 obtains voltage readings from DUT 620. In-factory screening has the advantages of improved equipment precision and accuracy, temperature control, and the ability to test on demand. Testing can be performed at one or more known currents or temperatures and can be repeated through one or more charging cycles and/or at one or more steps of the manufacturing process to identify a growing minor total-impedance contribution. Testing efficiency can be improved and per-unit test costs reduced by testing multiple units simultaneously. For example, current source 610 may force a substantially constant current through DUT 620 comprised of many series-connected units while voltmeter 630 measures voltages of each unit within DUT 620. Screening system 600 optionally includes a test jig to facilitate the simultaneous testing of multiple units.

However, not all defects are evident at time zero or can be screened in the factory. Some defects are latent, emerge with use, and risk becoming early life field failures. For example, an imperfect tab connection may have a low impedance at time zero but may crack and grow in impedance as the battery cycles. It is therefore desirable to have in-situ minor total-impedance variation testing capabilities in the field.

Figure 7:
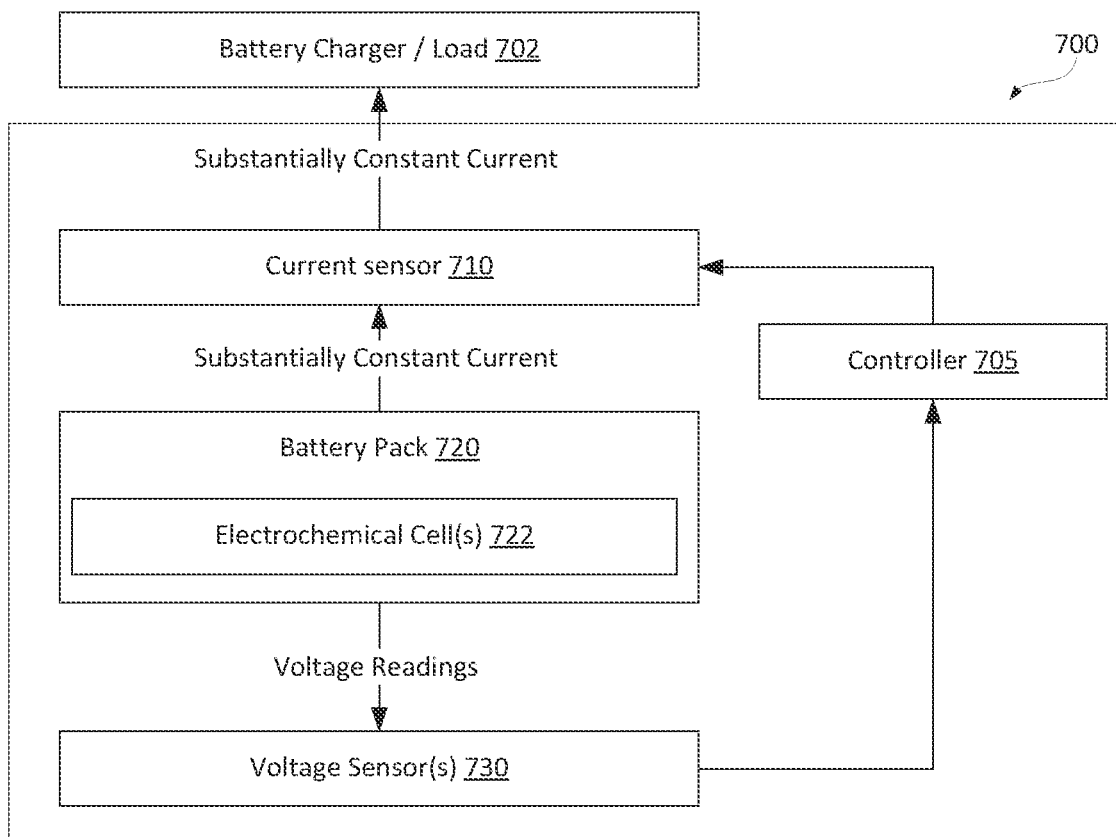
FIG. 7 is a block diagram of an in-situ monitoring system for detecting a variation in the minor total-impedance contributor of the total impedance in the set of electrochemical cells, in accordance with some examples.

FIG. 7. shows an example of in-situ monitoring system 700 with in-situ minor total-impedance characterization. Battery pack 720 is comprised of individual electrochemical cells 722 that are connected in parallel and series. For example, battery pack 720 may be in an electric vehicle and comprised of cell groupings of 1-4 parallel large form factor pouch or prismatic cells or up to 86 parallel cylindrical cells and 96 or more series-connected cell groupings. Voltage sensors 730 measure cell voltages and are communicatively coupled to controller 705. Current sensor 710 measures pack current (I) which is forced by a battery charger or a load of the electric vehicle (collectively shown as block 702 in FIG. 7). For example, in-situ monitoring system 700 may not have the ability to control the current and/or temperature of battery pack 720, and in-situ minor total impedance characterization can be opportunistic. For example, in-situ minor total impedance may be characterized during the constant current portion of the charging profile. Since Level 1, Level 2, and direct current (DC) fast charging typically charge battery pack 720 at different constant current levels, the in-situ minor total impedance may be tracked over time and with different constant current charge profiles and at different ambient and cell temperatures to improve fidelity. Alternately, in-situ monitoring system 700 may assert more control over the charging profile by requesting the user perform a certain desired charging routine (L1 vs. L2 vs. DC fast or over a certain SOC range) or communicate with the charger to command the desired charging current that is desired for the purpose of minor total impedance characterization. A sudden change in minor total impedance or its rate of change may be flagged as a defect. A difference in the minor total impedance profile of a cell or cell group compared to its peers in the pack may be flagged as a defect. For example, a cell or cell group is flagged as defective if the difference in its minor total impedance is greater than a threshold value away from the mean of its peers. Alternately, a cell or cell group is flagged as defective if its minor total impedance is outside the distribution of its peers (by being, for example, 4 or more, 5 or more, or 6 or more standard deviations away from the mean). There may be one or more criteria or one or more thresholds that provide an early warning of a defect versus a critical warning of a defect. A critical warning, for example, may include a warning to the driver and/or a requirement to replace the minimum serviceable unit within the battery pack (eg. the module containing the defect cell or cell group).

In another example, the in-situ minor total-impedance characterization can be targeted to selected groups of cells on demand through charge or discharge control of parallel cell groups. For example, large battery energy storage systems can be implemented as a number of parallel-coupled unit storage elements, such as battery racks or containers. Units may be coupled through direct current-direct current (DC-DC) converters to a common direct current (DC) bus or through direct current-alternating current (DC-AC) converters to a common alternating current (AC) bus. This parallel coupling through power electronics provides enhanced flexibility to operate one unit storage element in a minimum total impedance diagnostic mode while one or more remaining unit storage elements sink or source any required compensatory power to service the load.

In yet another example, in-situ minor total-impedance characterization can be targeted to selected groups of cells on demand through independent charge or discharge control of series cell groups. For example, FIG. 5 illustrates 2 or more series-connected nodes, each comprising a node controller, which can be implemented or comprise a DC-DC converter.

CONCLUSION

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present embodiments are to be considered illustrative and not restrictive.

What is claimed is:

1. A method of detecting a variation in a minor total-impedance contributor of a total impedance in a set of electrochemical cells, the method comprising:
   maintaining a substantially constant current through the set of electrochemical cells at a first temperature;
   obtaining multiple voltage readings from the set of electrochemical cells while the substantially constant current is maintained through the set of electrochemical cells;
   determining multiple differential capacity values from the multiple voltage readings; and
   determining the variation in the minor total-impedance contributor based on the multiple differential capacity values;

heating or cooling the set of electrochemical cells to a second temperature, different from the first temperature;
maintaining the substantially constant current through the set of electrochemical cells while the set of electrochemical cells is at the second temperature;
obtaining additional multiple voltage readings from the set of electrochemical cells while the substantially constant current is maintained through the set of electrochemical cells;
determining additional multiple differential capacity values from the additional multiple voltage readings; and
determining the variation in the minor total-impedance contributor based on the additional multiple differential capacity values.

2. The method of claim 1, further comprising characterizing one or more peaks in the multiple differential capacity values, wherein determining the variation in the minor total-impedance contributor is performed based on the one or more peaks, associated with different impedance channels.

3. The method of claim 2, wherein characterizing the one or more peaks in the multiple differential capacity values comprises one of:
determining second-order differential capacity values from the multiple differential capacity values, or
comparing a plot of the multiple differential capacity values to a reference plot.

4. The method of claim 1, wherein:
the total impedance is determined by the minor total-impedance contributor and a major total-impedance contributor,
the minor total-impedance contributor is attributed to a first portion of the set of electrochemical cells, and
the major total-impedance contributor is attributed to a second portion of the set of electrochemical cells, connected in series with the first portion.

5. The method of claim 1, wherein the set of electrochemical cells comprises multiple electrochemical cells connected in parallel.

6. The method of claim 1, wherein the variation in the minor total-impedance contributor is attributed to one or more characteristics selected from the group consisting of tab-weld quality, electrolyte wetting, tape damage, active-material activation energy variations material, and diffusion variations of an electrolyte of the electrochemical cells.

7. The method of claim 6, wherein the variation in the minor total-impedance contributor is used to differentiate one of the one or more characteristics.

8. The method of claim 1, further comprising associating the variation in the minor total-impedance contributor with one or more battery defects in the set of electrochemical cells.

9. The method of claim 1, wherein the multiple voltage readings are obtained from the set of electrochemical cells when the electrochemical cells are at a state of charge (SOC) selected based on and away from phase transition peaks of active materials of the electrochemical cells.

10. The method of claim 1, further comprising, after maintaining the substantially constant current and obtaining the multiple voltage readings repeating operations using an additional substantially constant current, thereby:
maintaining the additional substantially constant current through the set of electrochemical cells, wherein the additional substantially constant current is different from the constant current;
obtaining additional multiple voltage readings from the set of electrochemical cells while the additional substantially constant current is maintained through the set of electrochemical cells;
determining additional multiple differential capacity values from the additional multiple voltage readings;
characterizing one or more additional peaks in the multiple additional differential capacity values; and
determining the variation in the minor total-impedance contributor based on the one or more additional peaks.

11. The method of claim 10, wherein the additional substantially constant current is selected such that the one or more additional peaks, in the additional multiple differential capacity values, are more detectable than one or more peaks in the multiple differential capacity values determined while the set of electrochemical cells is subjected to the substantially constant current.

12. The method of claim 1, wherein a difference between the first temperature and the second temperature is at least about 10° C.

13. The method of claim 1, the second temperature is selected such that one or more additional peaks, in the additional multiple differential capacity values, are more detectable than one or more peaks in the multiple differential capacity values determined while the set of electrochemical cells is at the first temperature.

14. An apparatus for detecting a variation in a minor total-impedance contributor of a total impedance in a set of electrochemical cells, the apparatus comprising:
a current source configured to flow a substantially constant current through the set of electrochemical cells;
a voltmeter configured to obtain multiple voltage readings from each electrochemical cell in the set of electrochemical cells while the substantially constant current is applied to the set of electrochemical cells and while the set of electrochemical cells is at a first temperature and also to obtain additional multiple voltage readings from each electrochemical cell in the set of electrochemical cells while the substantially constant current is applied to the set of electrochemical cells and while the set of electrochemical cells is at a second temperature, different from the first temperature; and
a processing element configured to
determine multiple differential capacity values from the multiple voltage readings and also determine additional multiple differential capacity values from the additional multiple voltage readings, and
determine the variation in the minor total-impedance contributor based on the multiple differential capacity values and also based on the additional multiple differential capacity values.

15. The apparatus of claim 14, wherein the processing element is further configured to screen the set of electrochemical cells and associate the variation in the minor total-impedance contributor with one or more battery defects in the set of electrochemical cells.

16. The apparatus of claim 14, wherein the processing element is further configured to identify one or more electrochemical cells in the set of electrochemical cells when the variation in the minor total-impedance contributor associated with each of the one or more electrochemical cells is above a threshold.

17. The apparatus of claim 16, wherein the threshold is one of an expected-value threshold and a mean-of-population threshold.

18. The apparatus of claim 17, wherein:

the threshold is the mean-of-population threshold, and the one or more electrochemical cells are identified in the set of electrochemical cells when the variation in the minor total-impedance contributor associated with each of the one or more electrochemical cells is away from the mean-of-population threshold by at least a set Z-score.

19. The apparatus of claim 14, further comprising a temperature monitoring device configured to measure the first temperature and the second temperature.

20. An apparatus for in-situ diagnostics of a set of electrochemical cells based on variation in a minor total-impedance contributor of a total impedance in the set of electrochemical cells, the apparatus comprising:

a battery charger configured to flow a substantially constant current through the set of electrochemical cells;

a battery management system configured to obtain multiple voltage readings from each electrochemical cell in the set of electrochemical cells while the substantially constant current is applied to the set of electrochemical cells and while the set of electrochemical cells is at a first temperature and also to obtain additional multiple voltage readings from each electrochemical cell in the set of electrochemical cells while the substantially constant current is applied to the set of electrochemical cells and while the set of electrochemical cells is at a second temperature, different from the first temperature; and a processing element configured to determine multiple differential capacity values from the multiple voltage readings and also determine additional multiple differential capacity values from the additional multiple voltage readings, and determine the variation in the minor total-impedance contributor based on the multiple differential capacity values and also based on the additional multiple differential capacity values.

* * * * *